United States Patent
Booth, Jr. et al.

(10) Patent No.: US 8,652,916 B2
(45) Date of Patent: Feb. 18, 2014

(54) SELF ALIGNED IMPACT-IONIZATION MOS (I-MOS) DEVICE AND METHODS OF MANUFACTURE

(75) Inventors: Roger A. Booth, Jr., Wappingers Falls, NY (US); Paul Chang, Mahopac, NY (US); Kangguo Cheng, Guilderland, NY (US); Chengwen Pei, Danbury, CT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/426,966

(22) Filed: Mar. 22, 2012

(65) Prior Publication Data

US 2012/0208338 A1 Aug. 16, 2012

Related U.S. Application Data

(63) Continuation of application No. 13/025,609, filed on Feb. 11, 2011, now abandoned.

(51) Int. Cl.
  *H01L 21/336* (2006.01)
(52) U.S. Cl.
  USPC ........... 438/302; 438/151; 438/179; 438/286; 438/299; 438/301; 257/260; 257/262; 257/322; 257/387
(58) Field of Classification Search
  None
  See application file for complete search history.

(56) References Cited

U.S. PATENT DOCUMENTS

| | | | |
|---|---|---|---|
| 5,021,851 A | 6/1991 | Haken et al. | |
| 5,389,809 A | 2/1995 | Haken et al. | |
| 7,033,891 B2 | 4/2006 | Wilson et al. | |
| 7,176,483 B2 | 2/2007 | Grupp et al. | |
| 7,312,129 B2 | 12/2007 | Goktepeli et al. | |
| 7,648,868 B2 | 1/2010 | Majumdar et al. | |
| 2006/0125041 A1* | 6/2006 | Yang et al. | 257/476 |
| 2006/0202254 A1 | 9/2006 | Lai et al. | |
| 2008/0237703 A1* | 10/2008 | Lin et al. | 257/336 |
| 2009/0236657 A1 | 9/2009 | Ananthan | |
| 2009/0242996 A1 | 10/2009 | van Bentum et al. | |
| 2010/0032749 A1 | 2/2010 | Shrivastava et al. | |
| 2010/0041186 A1 | 2/2010 | Surdeanu | |
| 2010/0200916 A1 | 8/2010 | Gossner et al. | |

FOREIGN PATENT DOCUMENTS

WO  2008084364  7/2008

OTHER PUBLICATIONS

Gopalakrishnan, K., "I-MOS: A Novel Semiconductor Device with a Subthreshold Slope lower than kT/q", Stanford University, IEEE, 2002, 4 pages.

Choi, W. Y., "80nm Self-Aligned Complementary I-MOS Using Double Sidewall Spacer...", Seoul National University, IEEE, 2004, 4 pages.

(Continued)

*Primary Examiner* — Yasser A Abdelaziez
(74) *Attorney, Agent, or Firm* — Michael Le Strange; Roberts Mlotkowski Safran & Cole P.C.

(57) ABSTRACT

A method of forming a semiconductor structure, including forming a gate structure on a substrate; performing a first angled implantation on a first side of the gate structure to form a first doped region in the substrate, the first doped region partially extends within a channel of the gate structure and the gate structure blocks the first angled implantation from affecting the substrate on a second side of the gate structure; forming sidewall spacers on sidewalls of the gate; and forming a second doped region in the substrate on the second side of the gate, spaced apart from the channel.

18 Claims, 13 Drawing Sheets

(56) References Cited

OTHER PUBLICATIONS

Toh, E., "A Novel CMOS Compatible L-Shaped Impact-Ionization MOS (LI-MOS) Transistor", National University of Singapore, IEEE, 2005, 4 pages.

Choi, W. Y., "70nm Impact-Ionization Metal-Oxide-Semiconductor (I-MOS) Devices Integrated . . . ", Seoul National University, IEEE, 2005, 4 pages.

Charbuillet, C., "High Current Drive in Ultra-Short Impact Ionization MOS (I-MOS) Devices", STMicroelectronics, IEEE, 2006, 4 pages.

Choi, W. Y., "Impact-Ionization Metal-Oxide-Semiconductor (I-MOS) Devices Using Avalanche Breakdown Mechanism", Seoul National University, Feb. 2006, pp. 1-169, (177 pages).

Huat, T. E., "Simulation and Fabricatoin of Novel Devices With Steep Subthreshold Slope", National Univeristy of Singapore, 2008, pp. 1-186, (219 pages).

\* cited by examiner

SELF ALIGNED IMPACT-IONIZATION MOS (I-MOS) DEVICE AND METHODS OF MANUFACTURE

CROSS-REFERENCE TO RELATED APPLICATION

The present application is a continuation application to U.S. application Ser. No. 13/025,609, filed on Feb. 11, 2011, the contents of which are herein incorporated by reference in their entirety.

FIELD OF THE INVENTION

The invention relates to semiconductor structures and methods of manufacture and, more particularly, to a self-aligned impact-ionization MOS (I-MOS) device and method of manufacture

BACKGROUND

Metal-oxide-semiconductor field-effect transistor (MOSFET) scaling has been accelerated because of the MOSFET's excellent performance and scaling properties. However, as the size of the MOSFET is reduced down to a deep submicron region, it suffers from some critical problems. One such problem is the increase of the subthreshold swing, which indicates how effectively a MOSFET can be turned OFF as gate voltage is decreased below a threshold voltage. Even with a theoretically perfect MOSFET, the subthreshold swing is approximately 60 mV/decade at room temperature. However, in actuality imperfections in MOSFET devices such as the presence of interface states or a nonzero value of gate oxide thickness result in the subthreshold swing being greater than 60 mV/decade at room temperature. Moreover, as the MOSFET device scales down to the deep submicron regime, the subthreshold swing increases rapidly due to substrate doping concentration increase. Consequently, the subthreshold swing of a typical submicron MOSFETs tends to be roughly 100 mV/decade at room temperature. Thus, conventional MOSFET scaling is limited by the subthreshold swing barrier that cannot be lower than 60 mV/decade.

The concept of I-MOS devices were proposed to overcome the subthreshold swing limit by utilizing modulation of the avalanche breakdown voltage of a gated p-i-n structure to control output current. Since the p-n junction barrier lowering is not the mechanism of current flow control in the device, it can reduce the subthreshold swing to less than 60 mV/decade at room temperature. In particular, it has been demonstrated that a subthreshold swing of 5.5 mV/decade can be achieved in an I-MOS device. However, it can be extremely challenging to form I-MOS devices with small dimensions with a tight pitch.

Accordingly, there exists a need in the art to overcome the deficiencies and limitations described hereinabove.

BRIEF SUMMARY

In a first aspect of the invention, there is a method of forming a semiconductor structure, including forming a gate structure on a substrate. The method also includes performing a first angled implantation on a first side of the gate structure to form a first doped region in the substrate, the first doped region partially extends within a channel of the gate structure and the gate structure blocks the first angled implantation from affecting the substrate on a second side of the gate structure. The method also includes forming sidewall spacers on sidewalls of the gate. The method also includes forming a second doped region in the substrate on the second side of the gate, spaced apart from the channel.

In another aspect of the invention, there is a method of forming an I-MOS, including forming a gate on a substrate, the gate comprises a first side and a second side. The method also includes performing a first angled implantation of a first dopant type into the substrate on the first side of the gate to form a first doped region partially within a channel region. The method also includes forming sidewall spacers on the first and the second sides of the gate. The method also includes performing a second doping process of a second dopant type into the substrate on the second side of the gate to form a second doped region, remote from the channel region. The forming of the sidewall spacers is followed by the forming of the second doped region without any intervening photolithographic processes. The first dopant type is different than the second dopant type.

In yet another aspect of the invention, there is a method of forming an I-MOS, including forming a gate having first and second opposite sides on a substrate. The method also includes forming offset sidewall spacers on the first and second opposite sides of the gate. The method also includes performing a first angled implantation of a first dopant type into the substrate on the first side of the gate to form a first doped region. The method also includes forming sidewall spacers on sides of the offset sidewall spacers. The method also includes performing a second angled implantation of a second dopant type into the substrate on the second side of the gate to form a second doped region. No photolithographic step is performed between the forming the offset sidewall spacers and the forming the first doped region. No photolithographic step is performed between forming the sidewall spacers and forming the second doped region. A height of the gate in combination with an angle of the first angled implantation causes a shadow to be created from the gate that prevents the first angled implantation from affecting the substrate on the second side of the gate. The height of the gate in combination with an angle of the second angled implantation causes a shadow to be created from the gate that prevents the second angled implantation from affecting the first doped region on the first side of the gate.

In another aspect of the invention, a design structure tangibly embodied in a machine readable storage medium for designing, manufacturing, or testing an I-MOS is provided. The design structure comprises the structures of the present invention. In further embodiments, a hardware description language (HDL) design structure encoded on a machine-readable data storage medium comprises elements that when processed in a computer-aided design system generates a machine-executable representation of the I-MOS structure, which comprises the structures of the present invention. In still further embodiments, a method in a computer-aided design system is provided for generating a functional design model of the I-MOS structure. The method comprises generating a functional representation of the structural elements of the I-MOS structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a self-aligned I-MOS device and method of manufacture. In embodiments, a self-aligned I-MOS device is formed using angled implantation to create first and second doped regions, e.g., N+ drain and P+ source, which minimizes the need for expensive lithographic steps and allows for the formation of small I-MOS devices.

For example, in conventional I-MOS device manufacture, initially shallow trench isolation (STI) structures are formed, poly-silicon is deposited, a gate is predoped and patterned, and offset spacers are formed. The portion of the device to become the source is then masked in a lithographic step and a first doped region is formed, e.g., N+ drain. Additional spacers are then formed to protect the intrinsic region. The first doped region is then masked and the portion of the device to become the source is implanted to form a second doped region, e.g., P+ source.

However, a problem arises in the conventional method when making a small I-MOS device with a thin gate because the masks need to be aligned perfectly with the gate. For example, if the gate is completely covered or overlayed with the mask, the first doped region may not be implanted under the gate, and thus the I-MOS device will be unable to turn on.

Therefore, in accordance with the invention, the lithographic steps involving the alignment of the mask with the gate are eliminated by implanting the first doped region and the second doped region at an angle utilizing a shadowing effect of the gate for self-alignment of the doped regions. This process avoids the expensive lithographic steps and the need to precisely align the mask with the gate, while allowing for the formation of small I-MOS devices.

Figure 1:
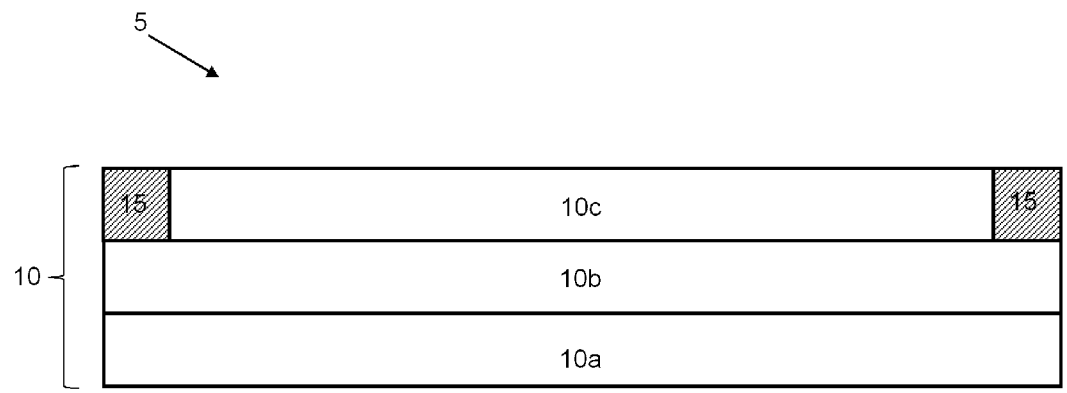
FIGS. 1-8 show processing steps and respective structures in accordance with aspects of the present invention.

FIGS. 1-8 show processing steps and resultant structures in accordance with embodiments of the invention. Specifically, FIG. 1 shows a structure 5 comprising a wafer 10. In embodiments, the wafer 10 may comprise a bulk silicon or silicon on insulator (SOI) wafer. In the SOI implementation, the wafer 10 comprises a substrate 10a, an insulation region 10b over the substrate 10a, and a semiconductor layer 10c (e.g., active silicon) over the insulation region 10b. In the bulk silicon implementation, reference numeral 10b can be representative of any isolation region or junction isolation.

More specifically, FIG. 1 shows an exemplary SOI wafer 10 employed as an intermediate structure in implementations of the invention. The SOI wafer 10 may be fabricated using techniques well known to those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 10a may be composed of any suitable material including, but not limited to, Si, SiGe, SiGeC, SiC, GE alloys, GaAs, InAs, InP, and other III/V or II/VI compound semiconductors. The buried insulation region 10b may be composed of oxide, such as $SiO_2$, and may be referred to as BOX layer 10b. Moreover, although the SOI wafer is referred to as "silicon on insulator," the semiconductor layer 10c is not limited to silicon. Instead, the semiconductor layer 10c may be comprised of various semiconductor materials, such as, for example, Si, SiGe, SiC, SiGeC, etc.

In embodiments, the SOI wafer 10 has a thickness of about 700 μm, with the BOX layer 10b having a thickness of about 0.1 μm, and the semiconductor layer 10c having a thickness of about 0.05 μm. However, the invention is not limited to these dimensions, and the various portions of the SOI wafer may have any desired thicknesses In embodiments, isolation structures 15 such as shallow trench isolation (STI) may be formed in portions of the wafer 10. The STI structures 15 can be formed in any conventional manner, such as, for example, masking portions of the semiconductor layer 10c, forming trenches in unmasked portions of the semiconductor layer 10c, filling the trenches with STI material, removing the mask, and planarizing the structure. In embodiments, the STI structures 15 are composed of oxide; although other insulator materials are also contemplated by the present invention.

Figure 2:
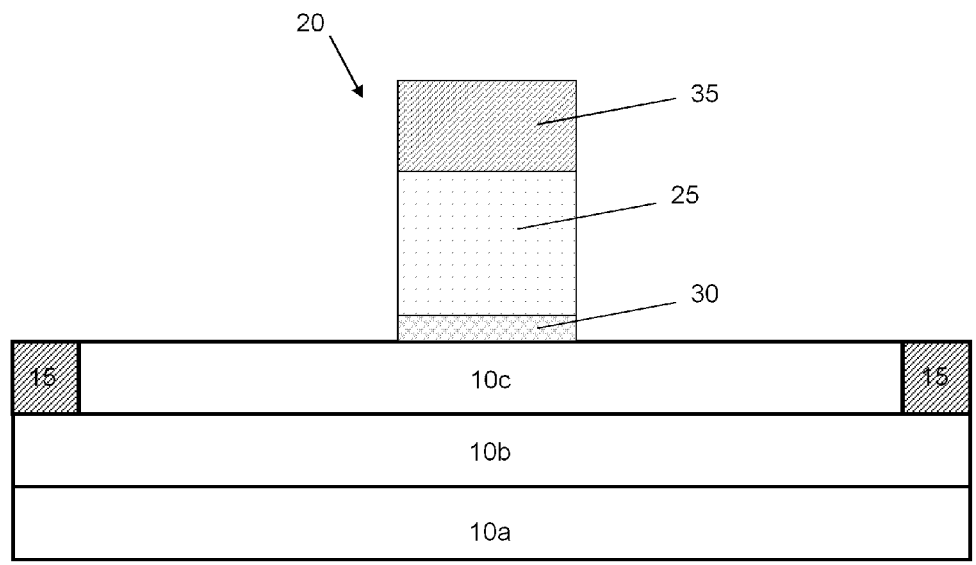

As shown in FIG. 2, a gate 20 is formed on the semiconductor layer 10c. For example, the gate 20 may comprise a gate body 25 (e.g., gate conductor), a gate dielectric 30, and a gate cap 35, and may be fabricated by conventional processes. For example, the gate dielectric 30 can be formed on an exposed surface (e.g., top) of the central region of semiconductor layer 10c. The gate dielectric 30 may be formed by any conventional deposition process such as atomic layer deposition (ALD), chemical vapor deposition (CVD) or plasma enhanced chemical vapor deposition (PECVD), or a thermal growing process such as oxidation, nitridation or oxynitridation. The gate dielectric 30 may include any device quality dielectric material such as an oxide, nitride, oxynitride, hafnium oxide or other high-k dielectric, or any combination and multilayer thereof. In embodiments, the gate dielectric 30 has a thickness of about 1-10 nm. However, the invention is not limited to this dimension, and the gate dielectric 30 may have any desired thickness based upon the intended use of the final semiconductor device The gate body 25 may be formed on the gate dielectric 30 utilizing a conventional deposition process. The gate body 25 may include a gate material such as polysilicon, amorphous silicon, metal or other materials suitable for I-MOS gate composition or any combination thereof. The gate material may be formed on the surface of the gate dielectric 30 utilizing conventional deposition processes well known in the art such as, for example, CVD, PECVD and plating. In embodiments, the gate body 25 has a thickness of about 2-10 nm. However, the invention is not limited to this dimension, and the gate body 25 may have any desired thickness based upon the intended use of the final semiconductor device Following formation of the gate body 25 on the gate dielectric 30, the gate body 25 and the gate dielectric 30 may be subjected to a conventional patterning process which includes lithography and etching steps. By way of example, the lithography step may entail applying a photoresist, exposing the photoresist to a pattern of radiation, and developing the pattern utilizing a conventional resist developer. Following the lithography step, a conventional etching process such as reactive-ion etching (RIE), plasma etching, ion beam etching or laser ablation may be employed in transferring the pattern to the gate body 25 and the gate dielectric 30.

The gate cap 35 may be formed using conventional techniques, such as for example, CVD, and may comprise conventional materials, such as, for example, oxide or nitride. In embodiments, the gate cap 35 has a thickness of about 50 nm; however, the invention is not limited to this dimension, and the gate cap 35 may have any desired thicknesses based upon the intended use of the final semiconductor device. The gate cap 35 can be a conventional layer. The entire gate 20 can have a height of about 100 nm.

Figure 3:
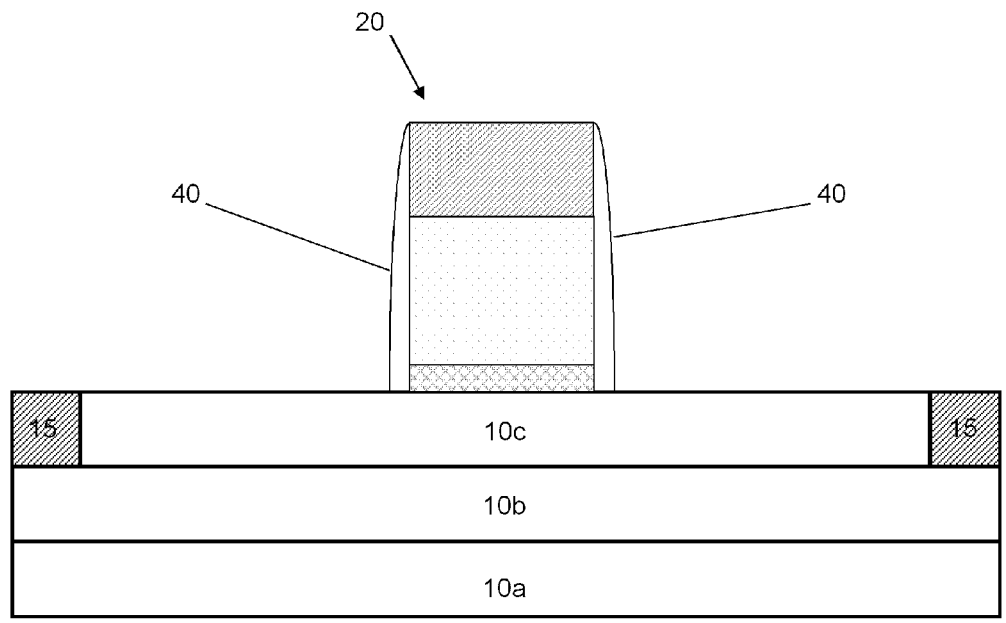

As shown in FIG. 3, offset spacers 40 may be formed along walls of the gate 20. For example, dielectric material such as a nitride (e.g., silicon nitride) may be selectively deposited on the side surfaces of the gate 20 in a conventional manner, such as by chemical vapor deposition CVD using a silane source. Other techniques, which may be suitable for deposition of a nitride layer, include low-pressure CVD (LPCVD) and atmospheric pressure CVD (APCVD). In embodiments, the offset spacers 40 have a thickness of about 10 nm. However, the invention is not limited to this dimension, and the offset spacers 40 may have any desired thicknesses based upon the intended use of the final semiconductor device.

Figure 4:
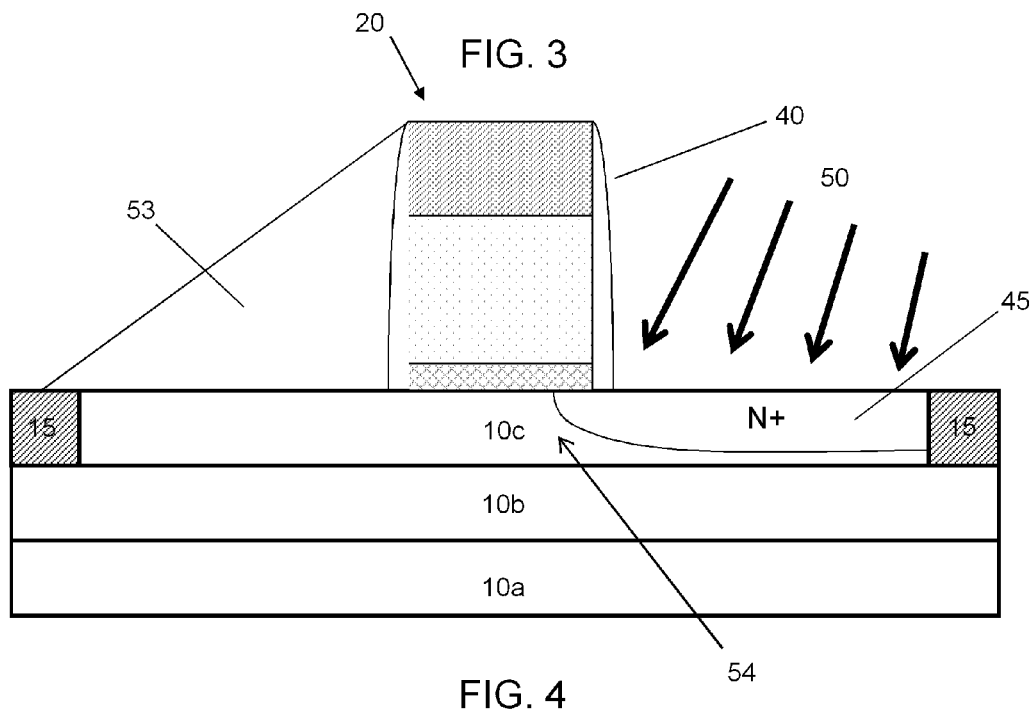

As shown in FIG. 4, a first doped region 45 (e.g., N+ drain) is formed in an outer region of the semiconductor layer 10c. The first doped region 45 may be formed using any suitable angled doping technique, such as ion-implantation. For example, ion-implantation, shown by arrows 50, may be employed to selectively dope the first doped region 45 with appropriate ions depending on the desired doping type of the source and drain regions (e.g., n-type, p-type, etc.). In embodiments, a single implantation process is used to implant phosphorous or arsenic ions into the P− type semiconductor layer 10c to a depth of less than the thickness of the semiconductor layer 10c. Alternatively, dopants can be implanted in a depth equal or greater than the thickness of the semiconductor layer 10c. The doping creates the first doped region 45 (e.g., N+ drain) in the semiconductor layer 10c and changes the outer region of the semiconductor layer 10c from P− type to an N+ type.

Further, any desired implantation energy and dosage and may be employed within the scope of the invention based upon the intended use of the final semiconductor device. In embodiments, the first doped region 45 can be doped at a non-zero angle relative to horizontal (e.g., about 30°-75° at a dosage ranging from about $3 \times 10^{13}$ cm$^{-2}$ to about $3 \times 10^{15}$ cm$^2$. More particularly, the implantation angle may depend on the height of the gate 20 and a predetermined space between two gates (not shown in the Figures) such that a shadow 53 of the gate 20 blocks implantation from occurring on an opposite side of the gate 20. For example, for a gate with a height of 100 nm and a space between two gates being 100 nm, the implantation angle may be about 60° relative to horizontal to form a sufficiently large enough shadow 53 to block implantation from occurring on the opposite side of the gate 20.

Advantageously, as can be seen in FIG. 4, the first doped region 45 is within a channel region 54 (e.g., under or overlapped) with the gate 20. The gate 20 also forms a shadow 53 that blocks the opposite side of the gate 20 from being implanted with ions. The formation of the shadow 53 enables for there to be no photolithographic step performed between the formation of the offset spacers 40 and the formation of the first doped region 45. Consequently, this process avoids expensive lithographic steps and the need to precisely align a mask with the gate 20, while allowing for the formation of small I-MOS devices. Also, in the case of a poly gate, it is possible to eliminate the spacers 40, thereby reducing processing steps and related costs.

Figure 5:
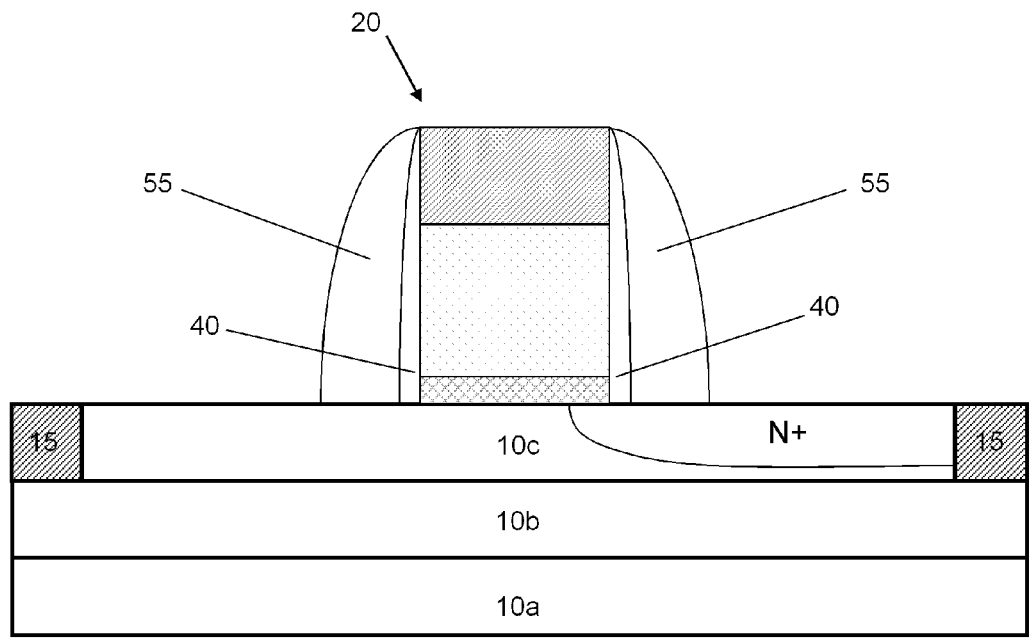

As shown in FIG. 5, additional spacers 55 may be formed along walls of the gate 20, on the offset spacers 40. For example, dielectric material such as a nitride (e.g., silicon nitride) may be selectively deposited on side surfaces of the offset spacers 40 in a conventional manner, such as by chemical vapor deposition CVD using a silane source. Other techniques, which may be suitable for deposition of a nitride layer, include low-pressure CVD (LPCVD) and atmospheric pressure CVD (APCVD). In embodiments, the additional spacers 55 have a thickness of about 5 nm-50 nm depending on the implant energy and dosage used in subsequent steps. However, the invention is not limited to this dimension, and the additional spacers 55 may have any desired thicknesses based upon the intended use of the final semiconductor device.

Figure 6:
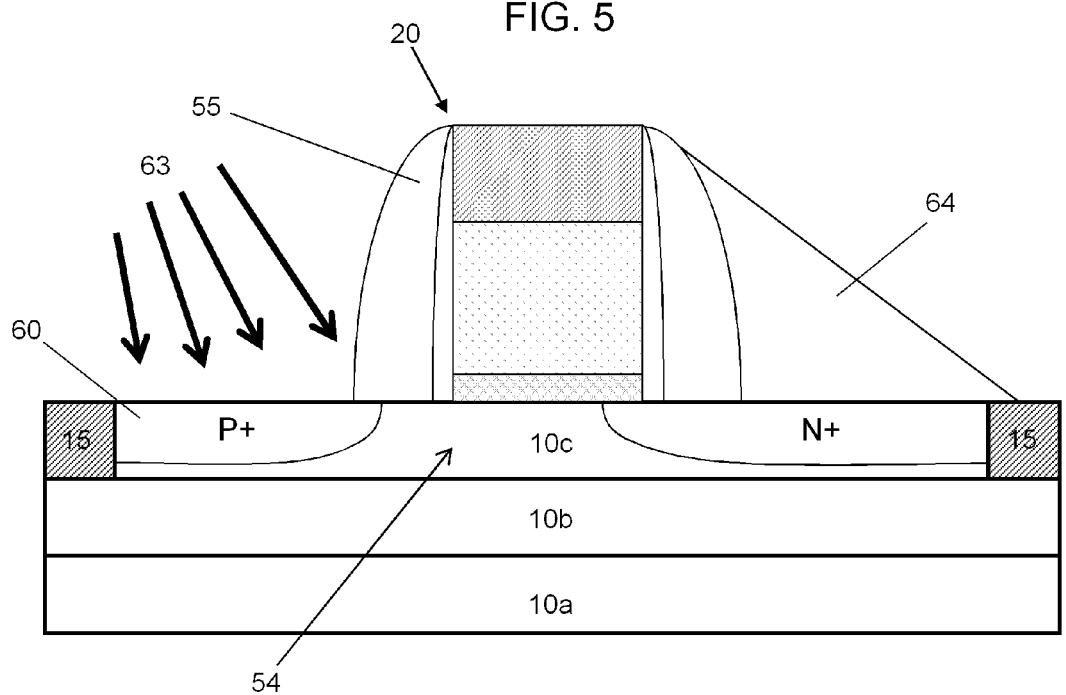

As shown in FIG. 6, a second doped region 60 (e.g., P+ source) is formed in a region of the semiconductor layer 10c remote from the channel region 54 of the gate 20. Accordingly, the doping of the first doped region 45 and the second doped region 60 is asymmetric about the gate 20. The second doped region 60 may be formed using any suitable angled doping technique, such as ion-implantation. For example, ion-implantation, shown by arrows 63, may be employed to selectively dope the second doped region 60 with appropriate ions depending on the desired doping type of the source and drain regions (e.g., n-type, p-type, etc.). In embodiments, a single implantation process is used to implant boron or indium ions into the P− type semiconductor layer 10c to a depth of less than the thickness of the semiconductor layer 10c. Alternatively, dopants can be implanted in a depth equal or greater than the thickness of the semiconductor layer 10c. The doping creates the second doped region 60 (e.g., P+ source) in the semiconductor layer 10c and changes the region of the semiconductor layer 10c from P− type to a P+ type.

Further, any desired implantation energy and dosage may be employed within the scope of the invention based upon the intended use of the final semiconductor device. In embodiments, the second doped region 60 can be doped at a non-zero angle relative to horizontal (e.g., about 60°-70° at a dosage of about $3 \times 10^{13}$ cm$^{-2}$ to about $3 \times 10^{15}$ cm$^{-2}$. More particularly, the implantation angle may depend on the height of the gate 20 and a predetermined space between two gates (not shown in the Figures) such that a shadow 64 of the gate 20 blocks implantation from occurring on an opposite side of the gate 20. For example, for a gate with a height of 100 nm and a space between two gates being 100 nm, the implantation angle may be about 60° relative to horizontal to form a sufficiently large enough shadow 64 to block implantation from occurring on the opposite side of the gate 20.

Advantageously, as can be seen in FIG. 6, the second doped region 60 is formed under or overlapped with the additional spacer 55 and spaced apart from the gate 20, (e.g., channel region 54) and the gate 20 forms a shadow 64 that blocks the opposite side of the gate 20 from being implanted with ions. The formation of the shadow 64 enables the elimination of additional photolithographic steps from being performed between the formation of the additional spacers 55 and the formation of the second doped region 60. Consequently, this process avoids expensive lithographic steps and the need to precisely align a mask with the gate 20, while allowing for the formation of small I-MOS devices.

Figure 7:
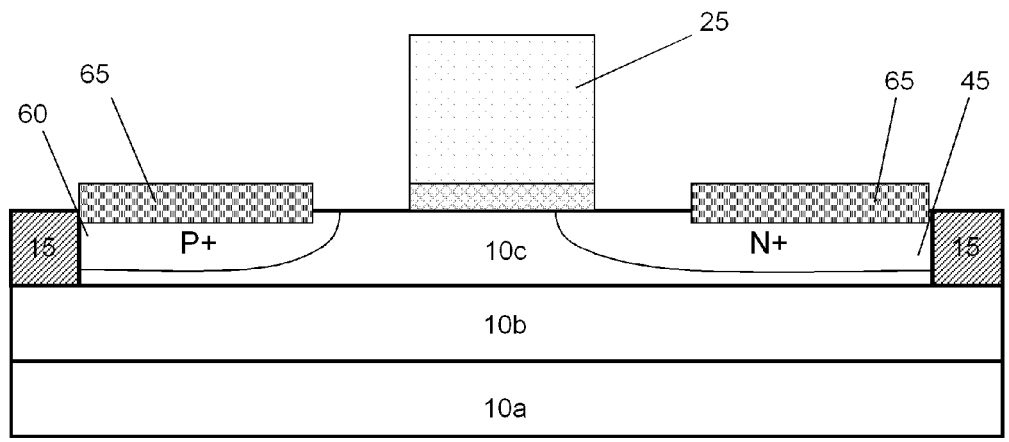

As shown in FIG. 7, silicide regions 65 may be formed in any suitable manner, and the gate cap 35, the offset spacers 40, and the additional spacers 55 may be stripped in any suitable manner. For example, in the instance that the gate body 25 was formed of a metal material, the silicide regions 65 may be formed over the first and the second doped (source/drain) regions 45 and 60, and then the gate cap 35, the offset spacers 40, and the additional spacers 55 may be stripped. In this way, as the gate is a metal gate structure, no silicide is formed on the top of the gate. Particularly, the silicide regions 65 may be formed by selectively sputtering a Cobalt (or Nickel) film onto the first and the second doped regions 45 and 60, and annealing the film to form a Cobalt (or Nickel) silicide. In embodiments, the silicide has a thickness of about 20 nm to 40 nm, although other thicknesses may be used within the scope of the invention. The stripping may be performed by any suitable conventional stripping process, such as, for example, wet or dry stripping.

Alternatively, in the instance that the gate body 25 was formed of polysilicon (not shown in the Figures), the gate cap 35, the offset spacers 40, and the additional spacers 55 may be stripped, and then the silicide regions 65 may be formed over the first and the second doped (source/drain) regions 45 and 60 and the gate body 25. In this way, silicide is formed on the gate 20, itself.

Figure 8:
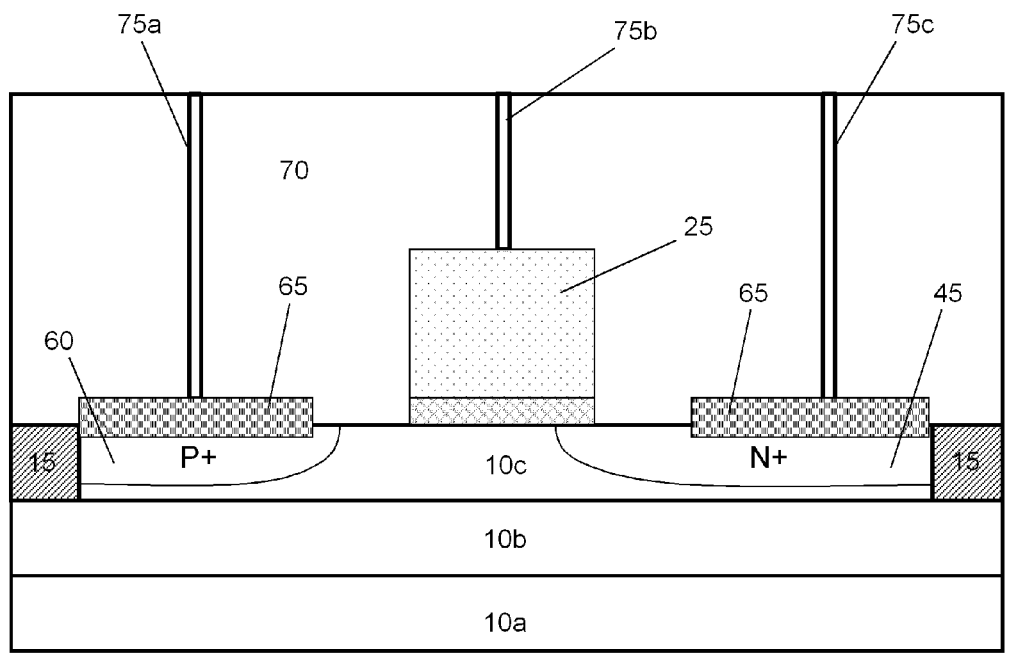

Middle-of-line (MOL) and/or back-end-of-line (BEOL) processes may be performed on the structure shown in FIG. 7. For example, as shown in FIG. 8, an interlevel dielectric (ILD) layer 70 may be deposited on the exposed surfaces and planarized. The ILD layer 70 may comprise any suitable dielectric material, for example, $SiO_2$, TEOS, borophosphosilicate glass (BPSG), high density plasma (HDP) oxide, etc. The ILD layer 70 may be deposited in any suitable manner such as CVD and may be planarized using CMP.

As further depicted in FIG. 8, contacts 75a, 75b and 75c may be formed in the ILD layer 70 to the gate, source, and drain regions. Any suitable contacts 75a, 75b and 75c may be formed using conventional materials and semiconductor fabrication techniques. For example, in embodiments, the contacts 75a, 75b and 75c comprise a liner and conductive material, and are formed by first forming contact holes in the ILD layer 70 down to, or slightly below, the upper surfaces of the gate body 25 and the first and the second doped regions 45 and 60. If silicide was previously formed on these features (e.g., the silicide regions 65), then the contact holes may be formed down to, or slightly below, the upper surface of the silicide. The liner is formed on the exposed surfaces of the contact holes. The liner may comprise, for example, Ta, TaN, Ti, TiN, Ru, RuN, W, WN, or any other material that can serve as a barrier to prevent conductive material from diffusing therethrough. Next, the contact holes are filled with a conductive material such as, for example, Cu, W, Al, Cu alloys, etc.

Figure 9:
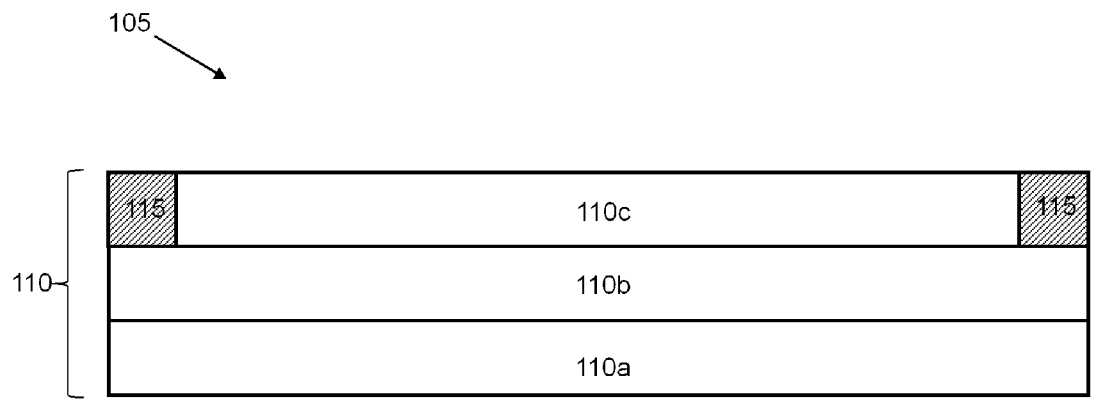
FIGS. 9-15 show processing steps and respective structures in accordance with additional aspects of the present invention.

FIGS. 9-15 show processing steps and resultant structures in accordance with additional embodiments of the invention. Specifically, FIG. 9 shows a structure 105 comprising a wafer 110. The wafer 110 may be similar to wafer 10. For example, the wafer 110 may comprise a substrate 110a, buried insulator layer 110b, semiconductor layer 110c, and STI structures 115, similar to those described above with regard to structure 5.

Figure 10:
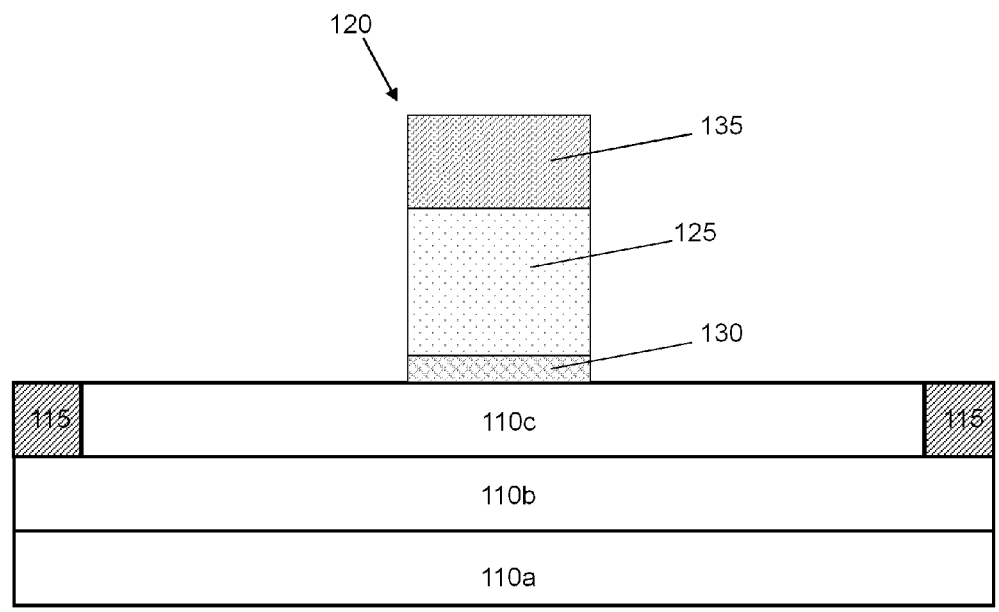

As depicted in FIG. 10, a gate 120 comprising a gate body 125 and a gate dielectric 130 is formed over the semiconductor layer 110c. The gate 120 may be formed using conventional semiconductor fabrication processes and materials. For example, a gate dielectric 130 may be formed on an exposed surface (e.g., top) of the semiconductor layer 110c, as described above with regard to the gate dielectric 30. Subsequently, a layer of gate conductor may be formed on the gate dielectric 130 utilizing a conventional deposition process such as CVD or PECVD, as described above with regard to gate body 25. The gate body 125 may include a non-metal gate material such as polysilicon, amorphous silicon, or other non-metal materials suitable for I-MOS gate composition. The deposited gate dielectric material and gate conductor material may be patterned to form the gate 120. The gate cap 135 may be formed using conventional techniques, such as for example, CVD, as described above with regard to the gate cap 35.

Figure 11:
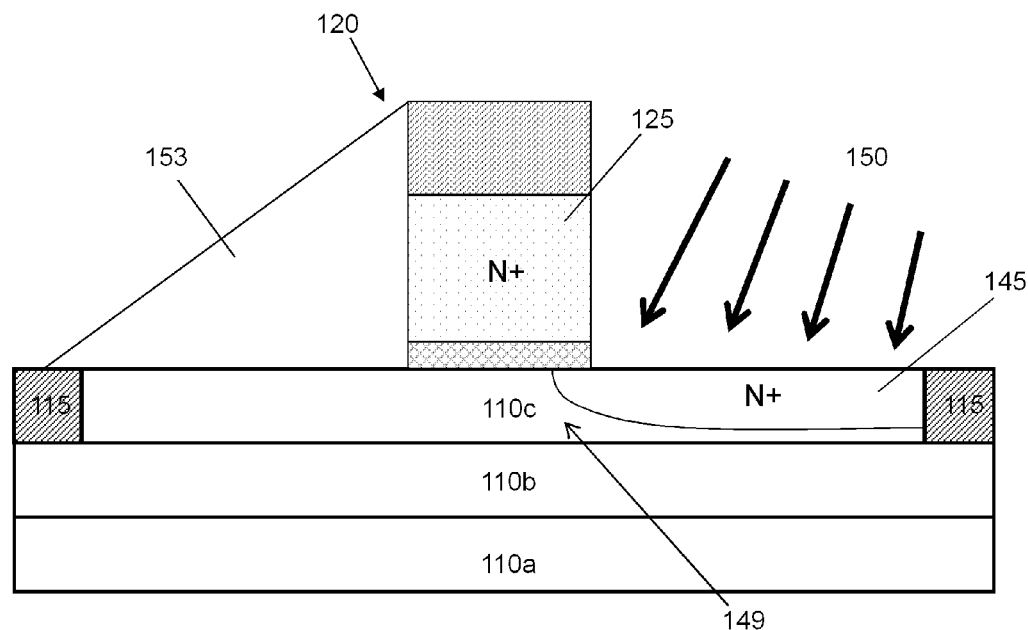

As shown in FIG. 11, a first doped region 145 (e.g., N+ drain) is formed in the semiconductor layer 110c partially within the channel region 149 of the gate 120. The first doped region 145 may be formed using any suitable angled doping technique, such as ion-implantation, as described above with regard to the first doped region 45. For example, ion-implantation, shown by arrows 150, may be employed to selectively dope the first doped region 145 with appropriate ions depending on the desired doping type of the source and drain regions (e.g., n-type, p-type, etc.)

As depicted in FIG. 11, in this embodiment offset spacers are not formed along sidewalls of the gate 120 due to the composition of the gate 120, e.g., non-metal. Thus, the gate body 125 including a non-metal gate material, such as polysilicon, may be exposed to the ion-implantation, shown by arrows 150. The gate body 125 may therefore be selectively doped with appropriate ions depending on the desired doping type of the first doped region 145.

As discussed above with regard to the first doped region 45, any desired implantation energy, dosage and implantation angle may be employed within the scope of the invention based upon the intended use of the final semiconductor device. More particularly, the implantation angle may depend on the height of the gate 120 and a predetermined space between two gates (not shown in the Figures) such that a shadow 153 of the gate 120 blocks implantation from occurring on an opposite side of the gate 120. For example, for a gate with a height of 100 nm and a space between two gates being 100 nm, the implantation angle may be about 60° relative to horizontal to form a sufficiently large enough shadow 153 to block implantation from occurring on the opposite side of the gate 120.

Advantageously, as can be seen in FIG. 11, the first doped region 145 is formed partially within the channel region 149, e.g., under or overlapped, with the gate 120, with the gate 120 forming the shadow 153 that blocks the opposite side of the gate 120 from being implanted with ions. The formation of the shadow 153 enables for there to be no photolithographic step performed between the formation of the gate 120 and the formation of the first doped region 145. Consequently, this process avoids expensive lithographic steps and the need to precisely align a mask with the gate 120, while allowing for the formation of small I-MOS devices.

Figure 12:
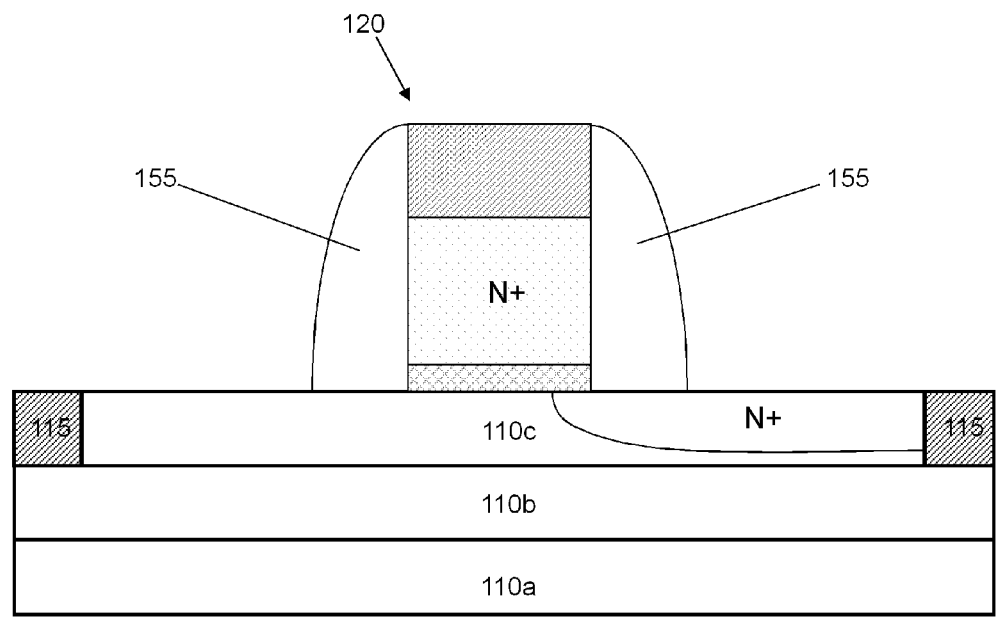

As shown in FIG. 12, spacers 155 may be formed along the sidewalls of the gate 120. For example, dielectric material such as a nitride (e.g., silicon nitride) may be selectively deposited on side surfaces of the gate 120 in a conventional manner, such as by chemical vapor deposition CVD using a silane source, as described above with regard to the additional spacers 55.

Figure 13:
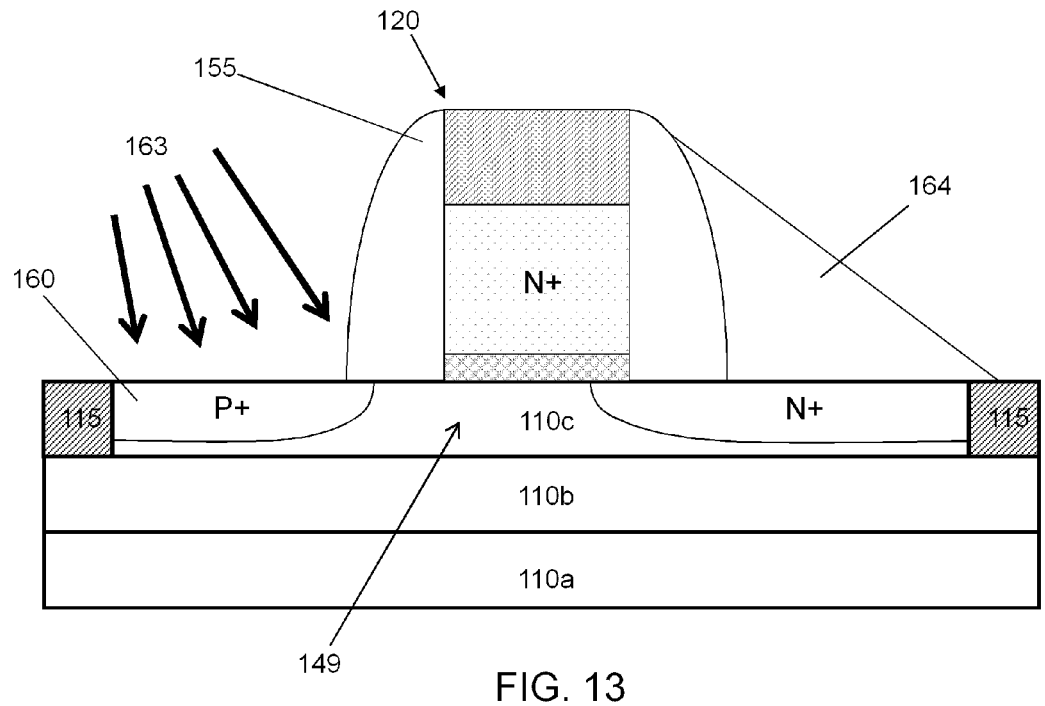

As shown in FIG. 13, a second doped region 160 (e.g., P+ source) is formed in an outer region of the semiconductor layer 110c remote from the channel region 149 of the gate 120. Accordingly, the doping of the first doped region 145 and the second doped region 160 is asymmetric about the gate 120. The second doped region 160 may be formed using any suitable angled doping technique, such as ion-implantation, as described above with regard to the second doped region 60. For example, ion-implantation, shown by arrows 163, may be employed to selectively dope the second doped region 160 with appropriate ions depending on the desired doping type of the source and drain regions (e.g., n-type, p-type, etc.).

As discussed above with regard to the second doped region 60, any desired implantation energy, dosage and implantation angle may be employed within the scope of the invention based upon the intended use of the final semiconductor device. More particularly, the implantation angle may depend on the height of the gate 120 and a predetermined space between two gates (not shown in the Figures) such that a shadow 164 of the gate 120 blocks implantation from occurring on an opposite side of the gate 120. For example, for a gate with a height of 100 nm and a space between two gates being 100 nm, the implantation angle may be about 60° relative to horizontal to form a sufficiently large enough shadow 164 to block implantation from occurring on the opposite side of the gate 120.

Advantageously, as can be seen in FIG. 13, the second doped region 160 is formed under or overlapped with the additional spacer 155 and spaced apart from the gate 120 (e.g., channel region 149), and the gate 120 forms the shadow 164 and blocks the opposite side of the gate 120 from being implanted with ions. The formation of the shadow 164 enables for there to be no photolithographic step performed between the additional spacers 155 and the formation of the second doped region 160. Consequently, this process avoids expensive lithographic steps and the need to precisely align a mask with the gate 120, while allowing for the formation of small I-MOS devices.

Figure 14:
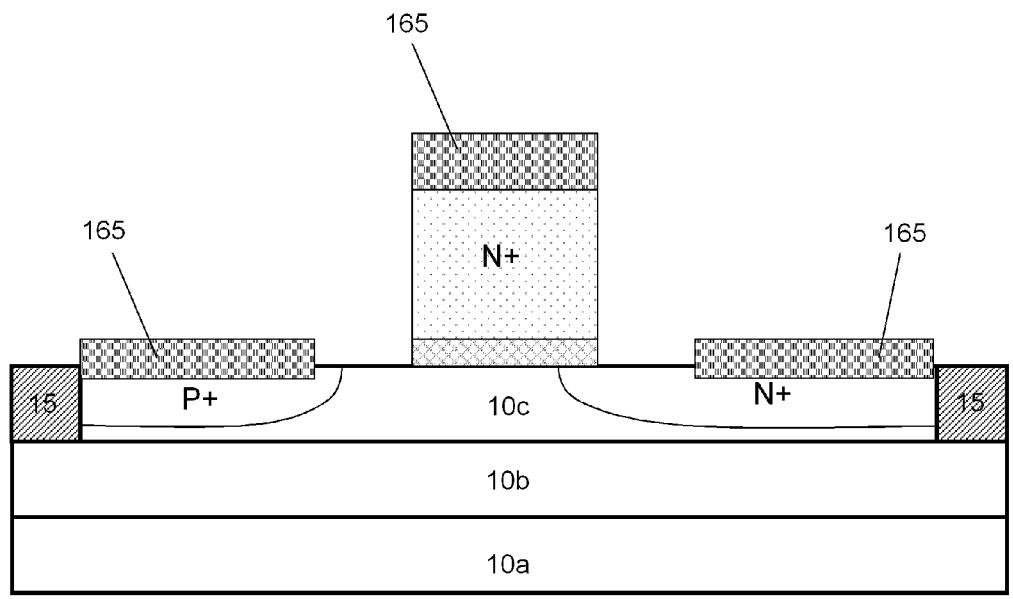

As shown in FIG. 14, silicide regions 165 may be formed in any suitable manner, and the gate cap 135 and the spacers 155 may be stripped in any suitable manner. For example, the gate cap 135 and the spacers 155 may be stripped by any suitable conventional stripping process, such as, for example, wet or dry stripping. Subsequently, the silicide regions 165 may be formed over the first and the second doped (source/drain) regions 145 and 160, and the gate body 125. Particularly, the silicide regions 165 may be formed by selectively sputtering a Cobalt (or Nickel) film onto the first and the second doped regions 145 and 160, and annealing the film to form a Cobalt (or Nickel) silicide, as described above with regard to silicide regions 65.

Figure 15:
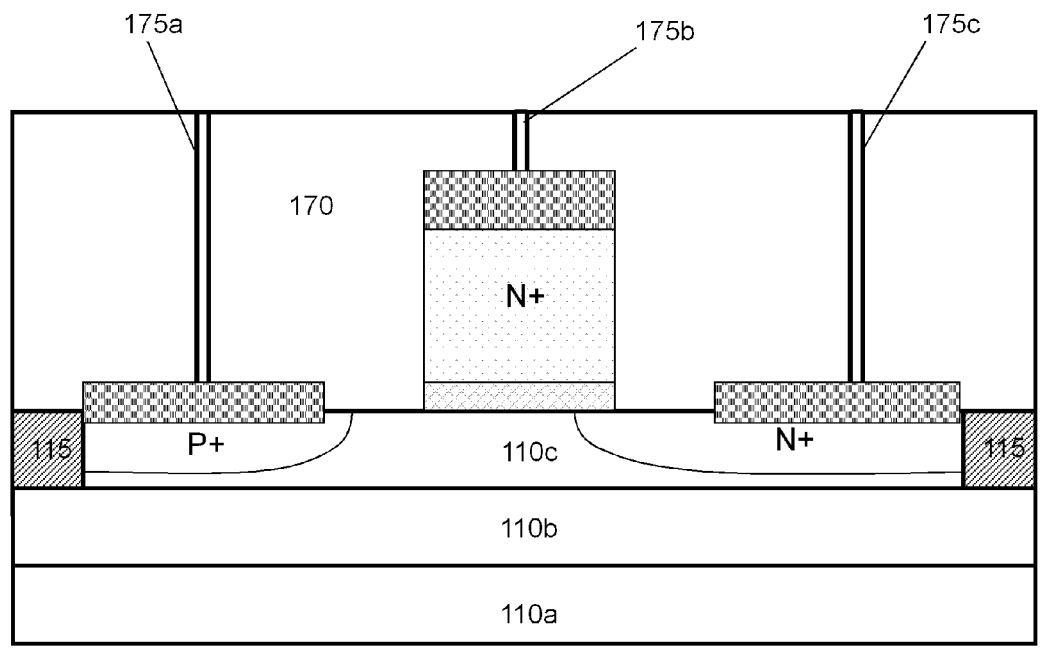

Middle-of-line (MOL) and/or back-end-of-line (BEOL) processes may be performed on the structure shown in FIG. 14, as described above with regard to structure 5. For example, as shown in FIG. 15, an interlevel dielectric (ILD) layer 170 may be deposited on the exposed surfaces and planarized and contacts 175a, 175b and 175c may be formed in the ILD layer 170.

Figure 16:
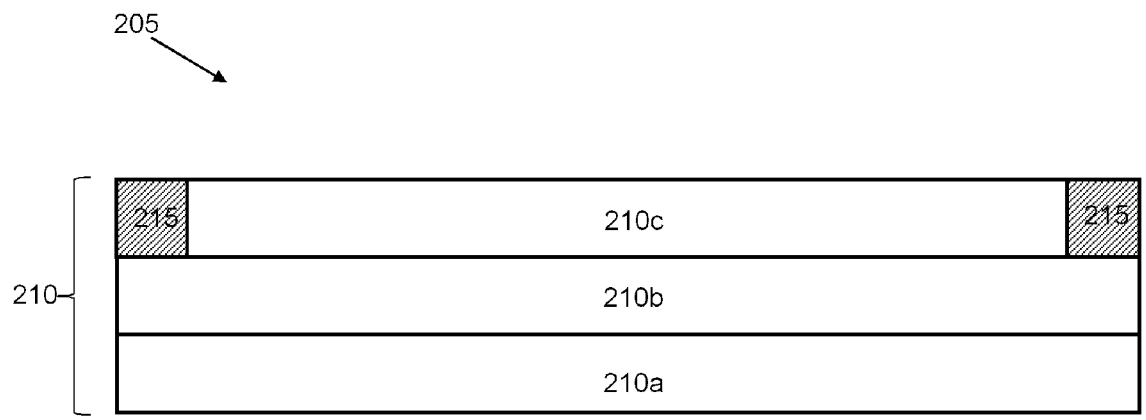
FIGS. 16-24 show processing steps and respective structures in accordance with additional aspects of the present invention.

FIGS. 16-24 show processing steps and resultant structures in accordance with additional embodiments of the invention. Specifically, FIG. 16 shows a structure 205 comprising a wafer 210. The wafer 210 may be similar to wafer 10. For example, the wafer 210 may comprise a substrate 210a, buried insulator layer 210b, semiconductor layer 210c, and STI structures 215, similar to those described above with regard to structure 5.

Figure 17:
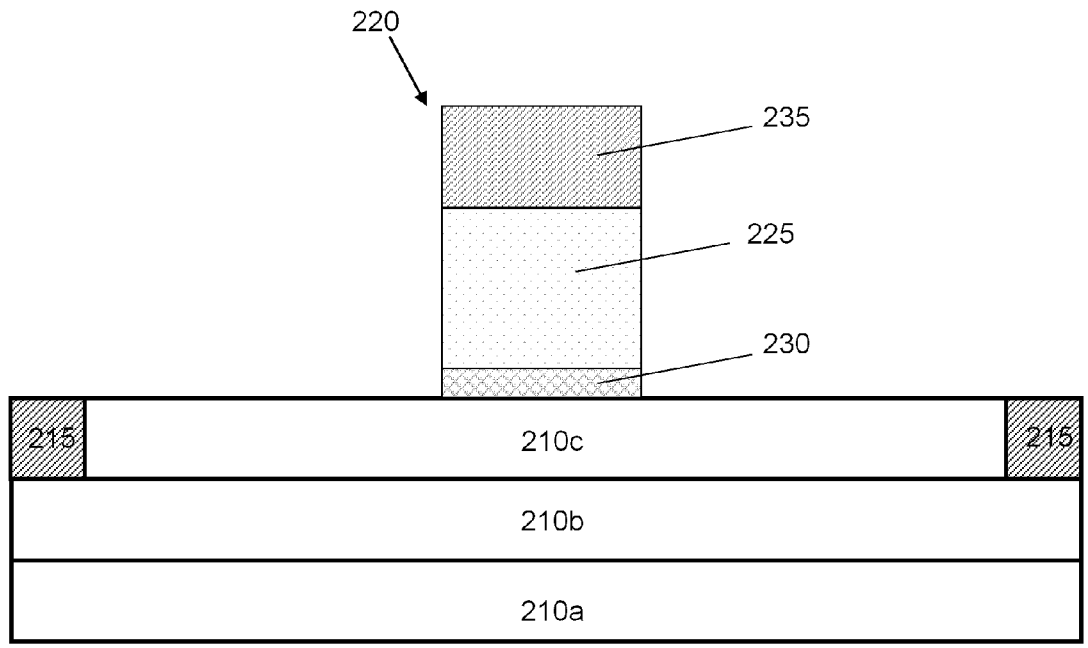

As depicted in FIG. 17, a gate 220 comprising a gate body 225 and a gate dielectric 230 is formed over the semiconductor layer 210c. The gate 220 may be formed using conventional semiconductor fabrication processes and materials. For example, a gate dielectric 230 may be formed on an exposed surface (e.g., top) of the semiconductor layer 210c, as described above with regard to the gate dielectric 30. Subsequently, a layer of gate conductor may be formed on the gate dielectric 230 utilizing a conventional deposition process such as CVD or PECVD, as described above with regard to gate body 25. The gate body 225 may include a gate material such as polysilicon, amorphous silicon, metal or other materials suitable for I-MOS gate composition or combination thereof. The deposited gate dielectric material and gate conductor material may be patterned to form the gate 220. The gate cap 235 may be formed using conventional techniques, such as for example, CVD, as described above with regard to gate cap 35.

Figure 18:
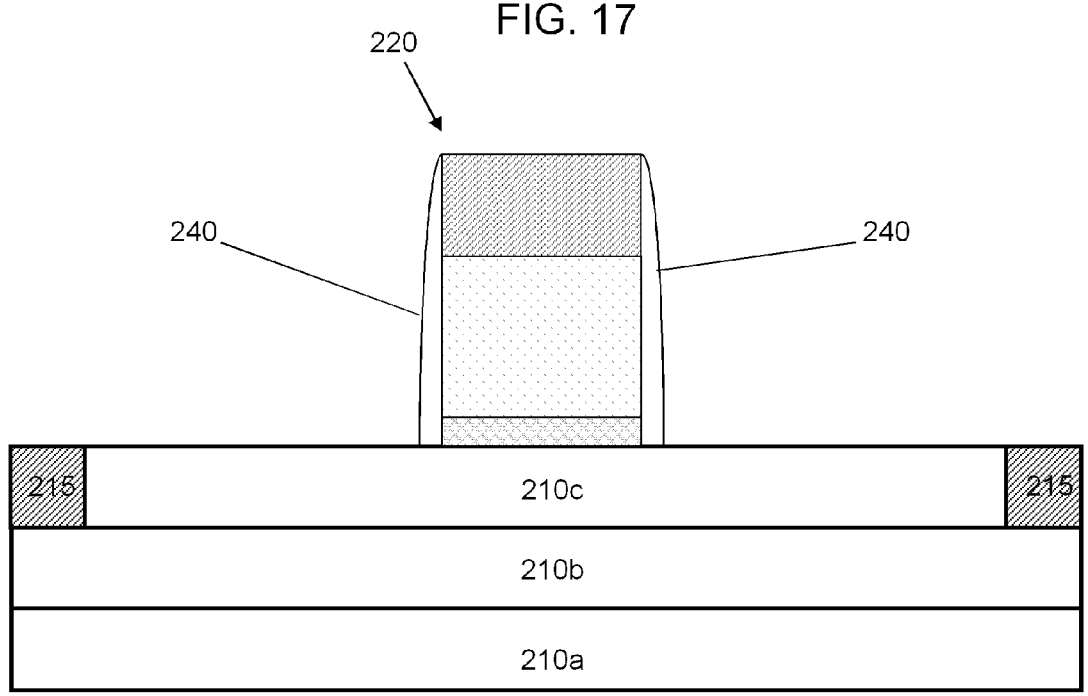

As shown in FIG. 18, offset spacers 240 may be formed along walls of the gate 220. For example, dielectric material such as a nitride (e.g., silicon nitride) may be selectively deposited on the side surfaces of the gate 220 in a conventional manner, such as by chemical vapor deposition CVD using a silane source, as discussed above with regard to offset spacers 40.

Figure 19:
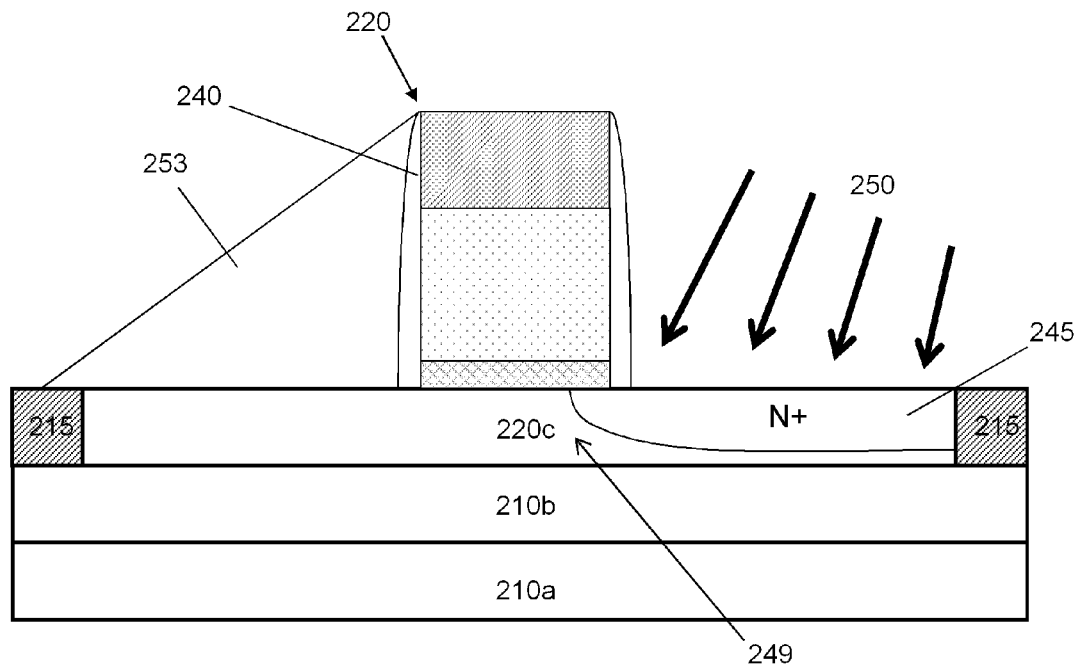

As shown in FIG. 19, a first doped region 245 (e.g., N+ drain) is formed in a region of the semiconductor layer 210c, including partially within the channel region 249. The first doped region 245 may be formed using any suitable angled doping technique, such as ion-implantation, as described above with regard to the first doped region 45. For example, ion-implantation, shown by arrows 250, may be employed to selectively dope the first doped region 245 with appropriate ions depending on the desired doping type of the source and drain regions (e.g., n-type, p-type, etc.)

As discussed above with regard to the first doped region 45, any desired implantation energy, dosage and implantation angle may be employed within the scope of the invention based upon the intended use of the final semiconductor device. More particularly, the implantation angle may depend on the height of the gate 220 and a predetermined space between two gates (not shown in the Figures) such that a shadow 253 of the gate 220 blocks implantation from occurring on an opposite side of the gate 220. For example, for a gate with a height of 100 nm and a space between two gates being 100 nm, the implantation angle may be about 60° relative to horizontal to form a sufficiently large enough shadow 253 to block implantation from occurring on the opposite side of the gate 220.

Advantageously, as can be seen in FIG. 19, the first doped region 245 is formed under or overlapped with the gate 220 and the gate 220 forms the shadow 253 that blocks the opposite side of the gate 220 from being implanted with ions. The formation of the shadow 253 enables there to be no photolithographic step performed between formation of the offset spacers 240 and the formation of the first doped region 245. Consequently, this process avoids expensive lithographic steps and the need to precisely align a mask with the gate 220, while allowing for the formation of small I-MOS devices.

Figure 20:
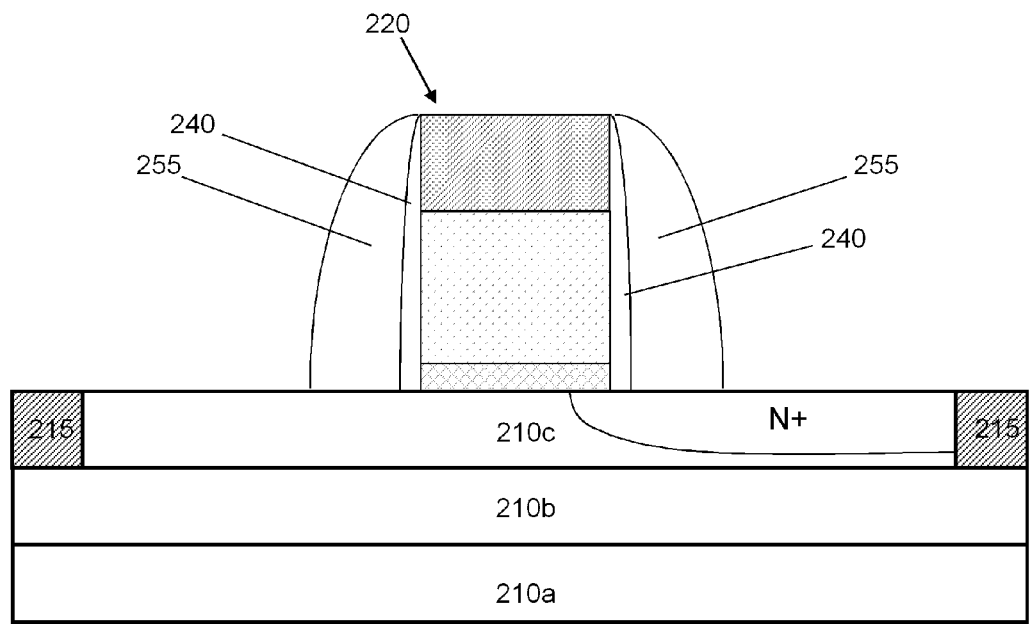

As shown in FIG. 20, additional spacers 255 may be formed along the sidewalls of the gate 220. For example, dielectric material such as a nitride (e.g., silicon nitride) may be selectively deposited on side surfaces of the offset spacers 240 in a conventional manner, such as by chemical vapor deposition CVD using a silane source, as described above with regard to the additional spacers 55.

Figure 21:
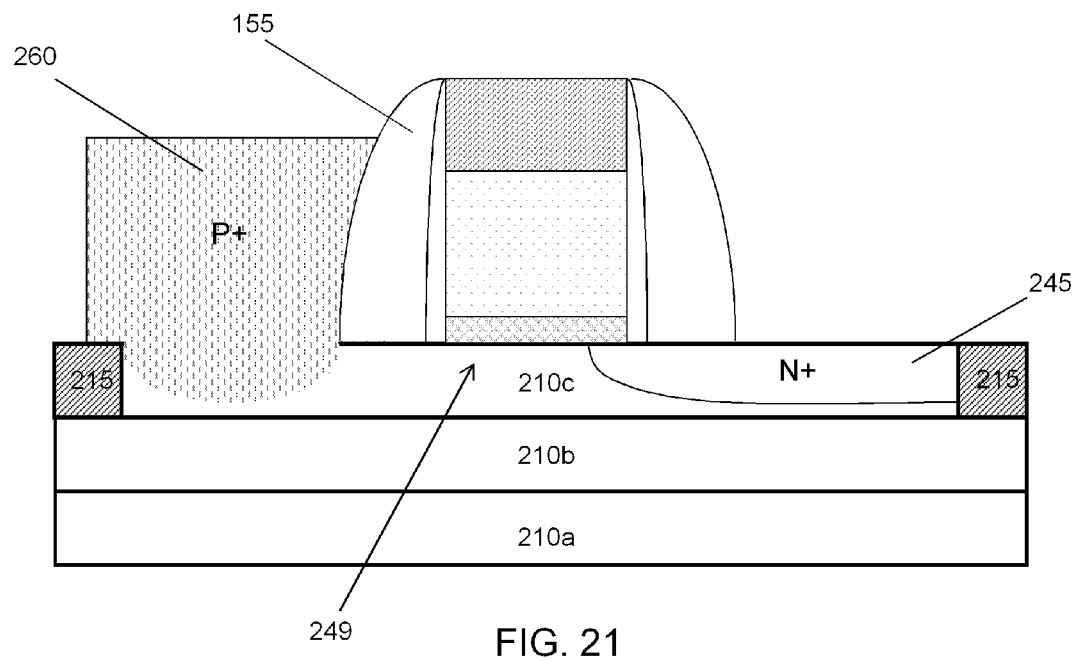

As shown in FIG. 21, a second doped region 260 (e.g., P+ source) is formed in the layer 210, remote from the channel region 249. The second doped region 260 is also raised above an outer region of the semiconductor layer 110c. The second doped region 260 may be formed by blocking the first doped region 245 using a mask or resist, using any suitable deposition process, and then epitaxially growing the material 260. For example, the second doped region 260 may be formed by epitaxial growing material with P+ dopants on a top surface of the outer region of the semiconductor layer 210c to a desired height. For example, the second doped region may be grown to a height of about 0.03 μm above the surface of the semiconductor layer 210c. The P+ dopants from the formed second doped region 260 diffuse partially into the semiconductor layer 210c, as depicted in FIG. 21 to complete the second doped region 260. The material may be, for example, boron doped polysilicon or boron doped silicon germanium.

Alternatively, the second doped region 260 may be formed without blocking the first doped region 245. For example, material with P+ dopants can be deposited on the first doped region 245 and a top surface of the outer region of the semiconductor layer 210c. The presence of the N+ dopants in the first doped region 245 causes a lower growth of the deposited material with P+ dopants over the first doped region 245. Thus, the deposited material with P+ dopants over the first doped region 245 can be etched back without significantly affecting the second doped region 260 on the opposite side of the gate 220 to expose the surface of the first dope region 245. The deposited material with P+ dopants is then epitaxially grown to form the second doped region 260 to a desired height.

Figure 22:
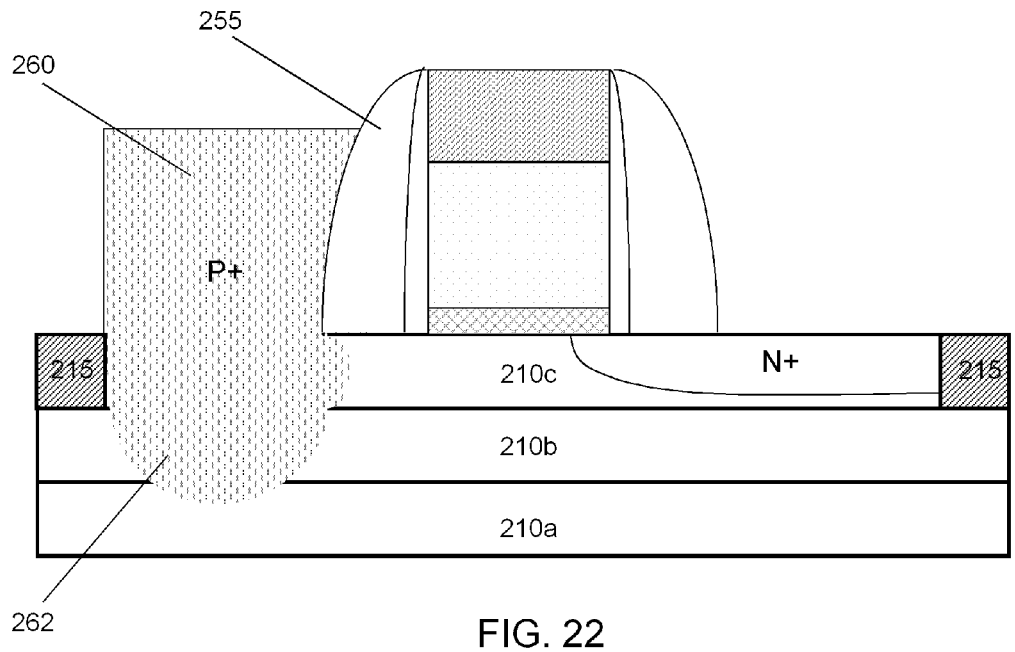

Alternatively, as depicted in FIG. 22, the second doped region 260 may be formed by drilling through the semiconductor layer 210c and the buried insulator layer 210b to expose the substrate 210a at a location spaced apart from the gate 220. A trench 262 formed from the drilling extends through the semiconductor layer 210c and the buried insulator layer 210b, and into the substrate 210a. Material may be formed, e.g., grown, into the trench 262. The material may include polysilicon with dopants (e.g., P+ dopants) or a metal, for example. The material 260 may then be epitaxially grown to form the second doped region 260 at a desired height. For example, the second doped region may be grown to a height of about 0.03 μm above the surface of the semiconductor layer 210c.

Advantageously, as can be seen in FIGS. 21 and 22, the second doped region 260 is formed under or overlapped with the additional spacer 255, spaced apart from the gate 220, and raised above the first doped region 245. Consequently, this process avoids expensive lithographic steps and the need to precisely align a mask with the gate 220, while allowing for the formation of small I-MOS devices.

Figure 23:
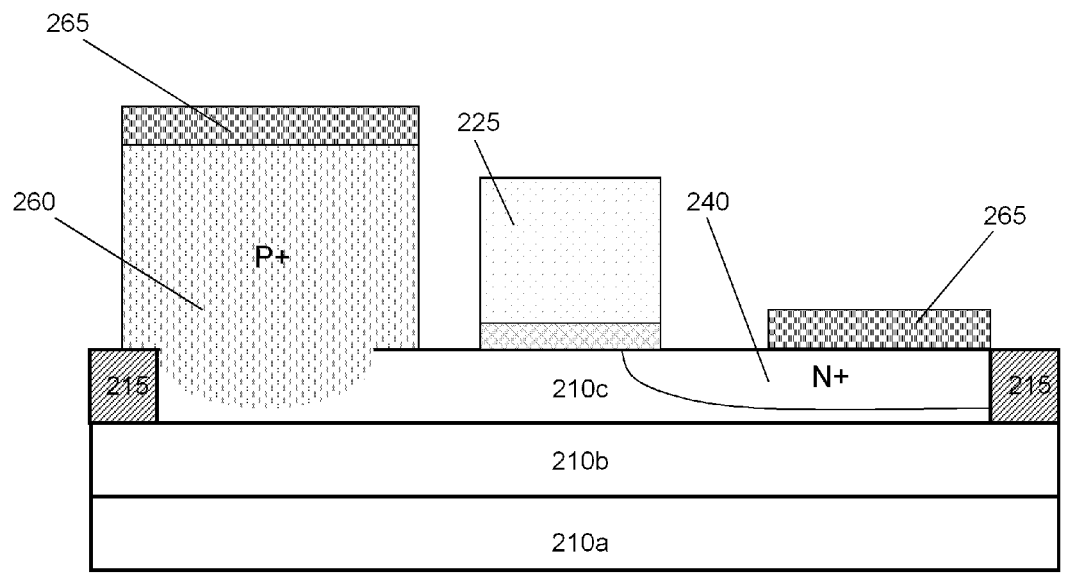

As shown in FIG. 23, silicide regions 265 may be formed in any suitable manner, and the gate cap 235, the offset spacers 240, and the additional spacers 255 may be stripped in any suitable manner. For example, in the instance that the gate body 225 was formed of a metal material, the silicide regions 265 may be formed over the first and the second doped (source/drain) regions 245 and 260, and then the gate cap 235, the offset spacers 240, and the additional spacers 255 may be stripped. Particularly, the silicide regions 265 may be formed by selectively sputtering a Cobalt (or Nickel) film onto the first and the second doped regions 245 and 260, and annealing the film to form a Cobalt (or Nickel) silicide, as described above with regard to the silicide regions 65.

Alternatively, in the instance that the gate body 225 was formed of polysilicon (not shown in the Figures), the gate cap 235, the offset spacers 240, and the additional spacers 255 may be stripped, and then the silicide regions 265 may be formed over the first and the second doped (source/drain) regions 245 and 260 and the gate body 225, as described above with regard to silicide regions 65.

Figure 24:
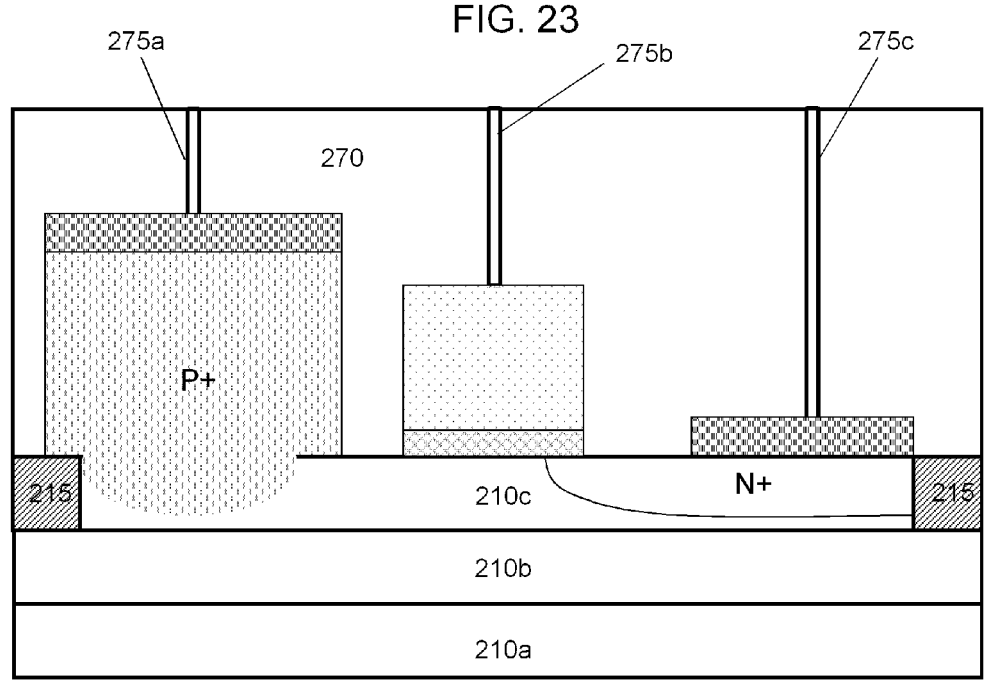

Middle-of-line (MOL) and/or back-end-of-line (BEOL) processes may be performed on the structure shown in FIG. 23, as described above with regard to structure 5. For example, as shown in FIG. 24, an interlevel dielectric (ILD) layer 270 may be deposited on the exposed surfaces and planarized and contacts 275a, 275b and 275c may be formed in the ILD layer 270.

Figure 25:
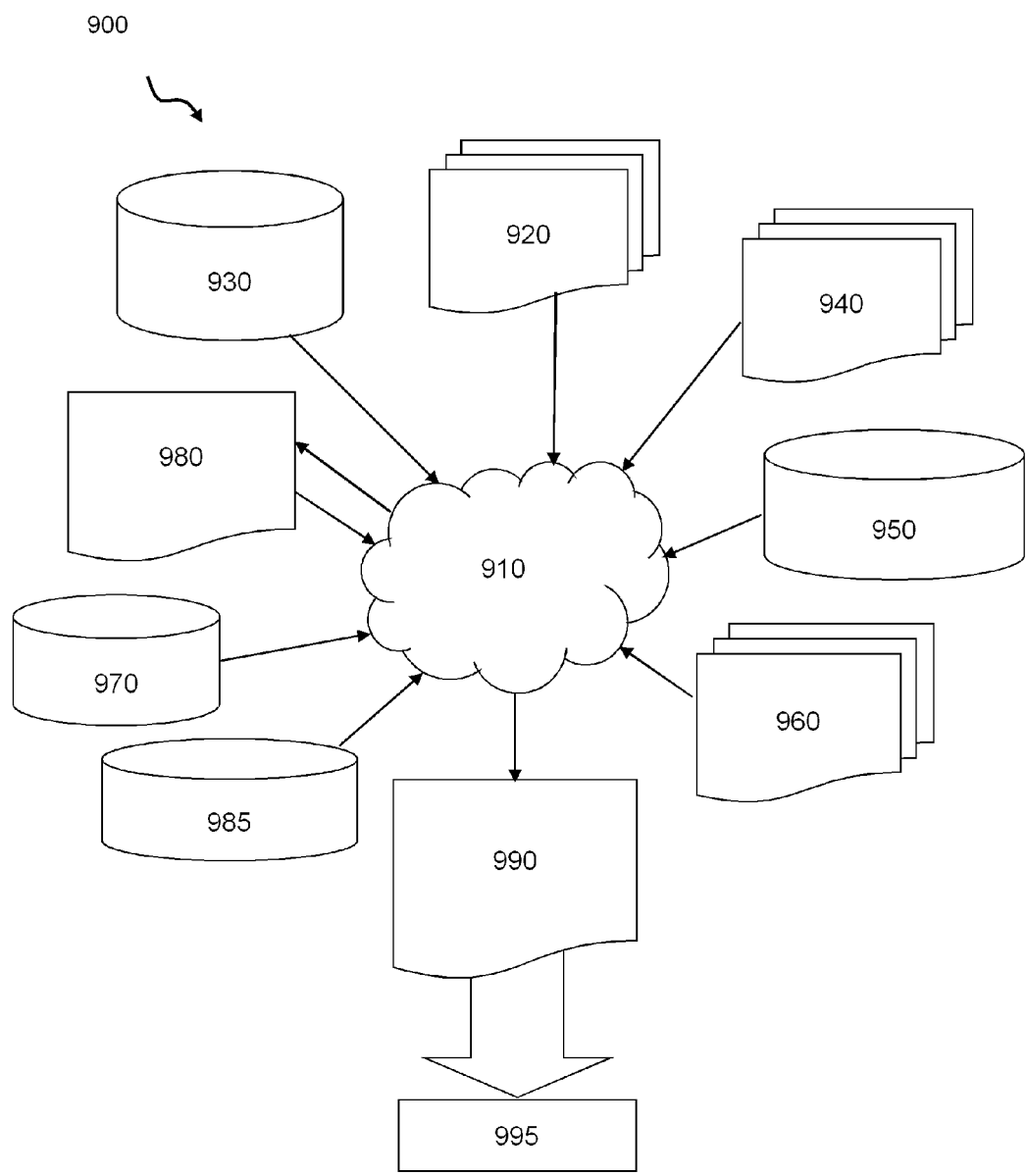
FIG. 25 is a flow diagram of a design process used in semiconductor design, manufacture, and/or test.

FIG. 25 is a flow diagram of a design process used in semiconductor design, manufacture, and/or test. FIG. 25 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-24. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 25 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-24. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-24 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-24. In one embodiment, design structure 990 may comprise a compiled, executable HDL simulation model that functionally simulates the devices shown in FIGS. 1-24.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-24. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:

forming a gate structure on a substrate;

performing a first angled implantation on a first side of the gate structure to form a first doped region in the substrate, the first doped region partially extending within a channel of the gate structure and the gate structure blocking the first angled implantation from affecting the substrate on a second side of the gate structure;

forming sidewall spacers on sidewalls of the gate; and forming a second doped region in the substrate on the second side of the gate, spaced apart from the channel, wherein forming the sidewall spacers is followed by forming the second doped region without any intervening photolithographic processes; and the semiconductor structure is an I-MOS.

2. The method of claim 1, wherein forming the gate structure is followed by performing the first angled implantation without any intervening photolithographic processes.

3. The method of claim 1, wherein forming the second doped region comprises performing a second angled implantation.

4. A method of forming a semiconductor structure, comprising:

forming a gate structure on a substrate;

performing a first angled implantation on a first side of the gate structure to form a first doped region in the substrate, the first doped region partially extending within a channel of the gate structure and the gate structure blocking the first angled implantation from affecting the substrate on a second side of the gate structure;

forming sidewall spacers on sidewalls of the gate; and forming a second doped region in the substrate on the second side of the gate, spaced apart from the channel, wherein the forming the second doped region comprises performing a second angled implantation; and the first angled implantation implants a first dopant type and the second angled implantation implants a second dopant type, the second dopant type being different than the first dopant type.

5. The method of claim 4, wherein a height of the gate in combination with an angle of the second angled implantation causes a shadow to be created on the first side of the gate that prevents the second angled implantation from affecting the first doped region on the first side of the gate.

6. The method of claim 1, wherein the sidewalls of the gate are exposed during the first angled implantation.

7. The method of claim 1, further comprising forming offset sidewall spacers on the sidewalls of the gate prior to performing the first angled implantation and the sidewall spacers are formed on sides of the offset sidewall spacers.

8. The method of claim 1, wherein a height of the gate in combination with an angle of the first angled implantation causes a shadow to be created on the second side of the gate which prevents the first angled implantation from affecting the substrate on the second side of the gate.

9. The method of claim 1, wherein:

the gate structure has a height of about 100 nm;

a predetermined space between the gate structure and another gate structure is about 100 nm; and the first angled implantation is performed at an angle of about 30°-75°.

10. The method of claim 1, wherein the second doped region comprises:

etching a trench into the substrate on the second side of the gate prior to forming the second doped region; and filling the trench with one of doped polysilicon to form the second doped region, and a metal to form the second doped region.

11. The method of claim 10, wherein:

the substrate is comprised in a silicon-on-insulator (SOI) wafer; and the SOI wafer comprises a buried insulator layer on the substrate and a silicon layer on the buried insulator layer.

12. The method of claim 11, wherein:

forming the gate structure comprises forming the gate structure on the silicon layer;

performing the first angled implantation forms the first doped region in the silicon layer; and the trench extends into the substrate.

13. The method of claim 1, wherein:

forming the second doped region in the substrate on the second side of the gate structure comprises forming a doped material to an elevational height greater than an elevational height of the first doped region; and the doped material extends into the substrate.

14. A method of claim 1, wherein the second doped region is formed in the substrate only on the second side of the gate.

15. A method of forming a semiconductor structure, comprising:

forming a gate on a substrate, the gate comprises a first side and a second side;

performing a first angled implantation of a first dopant type into the substrate on the first side of the gate to form a first doped region partially within a channel region;

forming sidewall spacers on the first and the second sides of the gate; and performing a second doping process of a second dopant type into the substrate on the second side of the gate to form a second doped region, remote from the channel region, wherein forming the sidewall spacers is followed by the forming the second doped region without any intervening photolithographic processes;

the first dopant type is different than the second dopant type; and the semiconductor structure is an I-MOS.

16. The method of claim 15, wherein:

the second doping process is a second angled implantation; and forming the gate is followed by performing the first angled implantation without any intervening photolithographic processes.

17. The method of claim 15, further comprising forming offset sidewall spacers on the first and the second sides of the gate prior to the performing the first angled implantation, wherein the sidewall spacers are formed on sides of the offset sidewall spacer.

18. The method of claim 15, wherein:

the first angled implantation is performed at an angle of about 30°-75°; and the gate has a sufficient height such that the gate forms a shadow on the second side of the gate which prevents the first angled implantation from affecting the substrate on the second side of the gate.

* * * * *